(12) United States Patent
Shi et al.

(10) Patent No.: US 12,317,715 B2
(45) Date of Patent: May 27, 2025

(54) PIXEL STRUCTURE AND DISPLAY PANEL

(71) Applicant: GUANGDONG JUHUA PRINTED DISPLAY TECHNOLOGY CO., LTD., Guangdong (CN)

(72) Inventors: Wen Shi, Guangdong (CN); Yawen Chen, Guangdong (CN); Jingyao Song, Guangdong (CN); Dong Fu, Guangdong (CN)

(73) Assignee: GUANGDONG JUHUA PRINTED DISPLAY TECHNOLOGY CO., LTD., Guangdong (CN)

( * ) Notice: Subject to any disclaimer, the term of this patent is extended or adjusted under 35 U.S.C. 154(b) by 367 days.

(21) Appl. No.: 17/286,908

(22) PCT Filed: Nov. 25, 2019

(86) PCT No.: PCT/CN2019/120742
§ 371 (c)(1),
(2) Date: Apr. 20, 2021

(87) PCT Pub. No.: WO2020/134794
PCT Pub. Date: Jul. 2, 2020

(65) Prior Publication Data
US 2021/0359034 A1    Nov. 18, 2021

(30) Foreign Application Priority Data
Dec. 29, 2018 (CN) .......................... 201811642761.1

(51) Int. Cl.
*H10K 59/35* (2023.01)

(52) U.S. Cl.
CPC ......... *H10K 59/353* (2023.02); *H10K 59/351* (2023.02); *H10K 59/352* (2023.02)

(58) Field of Classification Search
CPC ............................................. H10K 59/351–353
See application file for complete search history.

(56) References Cited

U.S. PATENT DOCUMENTS

| 7,733,359 B1 * | 6/2010 | Hagge ................. H10K 59/131 |
|---|---|---|
| | | 349/146 |
| 2007/0024183 A1 | 2/2007 | Lih et al. |

(Continued)

FOREIGN PATENT DOCUMENTS

| CN | 102262854 A | 11/2011 |
|---|---|---|
| CN | 102830450 A | 12/2012 |

(Continued)

OTHER PUBLICATIONS

International Search Report and Written Opinion from International Application No. PCT/CN2019/120742 mailed Feb. 26, 2020.

*Primary Examiner* — Eric K Ashbahian
(74) *Attorney, Agent, or Firm* — Dorsey & Whitney LLP

(57) ABSTRACT

Disclosed are a pixel structure and a display panel. The pixel structure includes a plurality of pixel units, each pixel unit is in a shape of a rectangle, the pixel unit includes four sub-pixels, respectively one first sub-pixel, two second sub-pixels, and one third sub-pixel, the two second sub-pixels are connected by a sharing edge to form one second sub-pixel unit, the first sub-pixel and the third sub-pixel are respectively provided on opposite sides of the second sub-pixel unit. The pixel structure and the display panel provided by the present disclosure have a high resolution.

18 Claims, 7 Drawing Sheets

(56) References Cited

U.S. PATENT DOCUMENTS

| | | | |
|---|---|---|---|
| 2007/0236134 A1 | 10/2007 | Ho et al. | |
| 2014/0197385 A1* | 7/2014 | Madigan | H10K 50/81 |
| | | | 438/34 |
| 2016/0315126 A1 | 10/2016 | Huang et al. | |
| 2016/0329385 A1* | 11/2016 | Qiu | H10K 59/352 |
| 2016/0372020 A1* | 12/2016 | Jin | G09G 3/20 |
| 2018/0212001 A1* | 7/2018 | Bai | H10K 59/351 |
| 2020/0075687 A1* | 3/2020 | He | H10K 59/351 |

FOREIGN PATENT DOCUMENTS

| | | |
|---|---|---|
| CN | 103123927 A | 5/2013 |
| CN | 103632618 A | 3/2014 |
| CN | 103811533 A | 5/2014 |
| CN | 104464541 A | 3/2015 |
| CN | 104465592 A | 3/2015 |
| CN | 104465714 A | 3/2015 |
| CN | 104616597 A | 5/2015 |
| CN | 104752469 A | 7/2015 |
| CN | 104809956 A | 7/2015 |
| CN | 104916661 A | 9/2015 |
| CN | 105206643 A | 12/2015 |
| CN | 105225612 A | 1/2016 |
| CN | 204991713 U | 1/2016 |
| CN | 205231067 U | 5/2016 |
| CN | 107248522 A | 10/2017 |
| CN | 107579106 A | 1/2018 |
| CN | 108389887 A | 8/2018 |
| CN | 108510891 A | 9/2018 |

\* cited by examiner

PIXEL STRUCTURE AND DISPLAY PANEL

CROSS REFERENCE TO RELATED APPLICATIONS

The present application is a U.S. National Stage Application of PCT International Application No. PCT/CN2019/120742 filed on Nov. 25, 2019, which claims priority to Chinese Patent Application No. 201811642761.1, filed on Dec. 29, 2018 and entitled "Pixel Structure and Display Panel", and the content of each of which is herein incorporated by reference in its entirety.

TECHNICAL FIELD

The present disclosure relates to the field of display technology, and particularly to a pixel structure and a display panel.

BACKGROUND

Organic light emitting diodes (OLEDs) have become the mainstream of display in the future due to the advantages such as self-luminous, fast response, wide viewing angle, high brightness, and thinness, etc. Currently, the vapor-deposited organic light emitting materials are usually utilized to emit light independently as a way to implement a full-color OLED display, which mainly uses a sophisticated metal shadow mask and pixel alignment technology to manufacture the red, green, and blue light emitting layers by the vapor deposition. However, the conventional method is limited by the accuracy of a pattern size of the metal shadow mask, which limits the resolution of the OLED display manufactured by the vapor deposition of the organic light emitting materials.

SUMMARY

In view of this, as for the above technical problem, it is necessary to provide a pixel structure and a display panel capable of improving the resolution.

A pixel structure is provided, which includes a plurality of pixel units, wherein each pixel unit is in a shape of a rectangle, the pixel unit includes four sub-pixels, respectively one first sub-pixel, two second sub-pixels, and one third sub-pixel, the two second sub-pixels are connected by a sharing edge to form one second sub-pixel unit, the first sub-pixel and the third sub-pixel are respectively provided on opposite sides of the second sub-pixel unit.

In an embodiment, in the pixel unit, the one first sub-pixel, the one third sub-pixel, and the two second sub-pixels are arranged in a row, the first sub-pixel and the third sub-pixel are both in a shape of a triangle, two right angles located on a same long side of the rectangle in the rectangular pixel unit are respectively an angle between two sides of the first sub-pixel and an angle between two sides of the third sub-pixel.

In an embodiment, the pixel units are repeatedly arranged to form a pixel row in a first direction, and any two adjacent pixel units in each pixel row are connected to each other by same sub-pixels, and the adjacent same sub-pixels are connected by a sharing edge;

the pixel units are repeatedly arranged to form a pixel column in a second direction, a second sub-pixel unit in any pixel unit in each pixel column is connected to a second sub-pixel unit in an adjacent pixel unit by a sharing edge.

In an embodiment, in each pixel column and in the second direction, a first sub-pixel in any pixel unit is connected to a third sub-pixel in an adjacent pixel unit by a sharing edge.

In an embodiment, in each pixel column and in the second direction, a first sub-pixel in any pixel unit is connected to a first sub-pixel in an adjacent pixel unit by a sharing edge, and a third sub-pixel in any pixel unit is connected to a third sub-pixel in an adjacent pixel unit by a sharing edge.

In an embodiment, four pixel units are arranged in two rows and two columns to form a repeating unit, the repeating unit is repeatedly arranged in the pixel row and the pixel column respectively to form the pixel structure, a first pixel row in the repeating unit includes the first sub-pixel, the second sub-pixel unit, the third sub-pixel, the third sub-pixel, the second sub-pixel unit, and the first sub-pixel which are sequentially arranged along a pixel row direction; a second pixel row in the repeating unit includes the third sub-pixel, the second sub-pixel unit, the first sub-pixel, the first sub-pixel, the second sub-pixel unit, and the third sub-pixel which are sequentially arranged along a pixel row direction.

In an embodiment, sixteen pixel units are arranged in four rows and four columns to form a repeating unit, the repeating unit is repeatedly arranged in the pixel row and the pixel column respectively to form the pixel structure, a first pixel row in the repeating unit includes the first sub-pixel, the second sub-pixel unit, the third sub-pixel, the third sub-pixel, the second sub-pixel unit, and the first sub-pixel which are sequentially arranged along the pixel row direction; a second pixel row in the repeating unit includes the first sub-pixel, the second sub-pixel unit, the third sub-pixel, the third sub-pixel, the second sub-pixel unit, the first sub-pixel which are sequentially arranged along the pixel row direction; and a third pixel row in the repeating unit includes the third sub-pixel, the second sub-pixel unit, the first sub-pixel, the first sub-pixel, the second sub-pixel unit, and the third sub-pixel which are sequentially arranged along the pixel row direction; a fourth pixel row in the repeating unit includes the third sub-pixel, the second sub-pixel unit, the first sub-pixel, the first sub-pixel, the second sub-pixel unit, and the third sub-pixel which are sequentially arranged along the pixel row direction.

In an embodiment, the first sub-pixel is a red sub-pixel, the second sub-pixel is a green sub-pixel, the second sub-pixel unit includes two green sub-pixels, the third sub-pixel is a blue sub-pixel.

In an embodiment, the second sub-pixel is in a shape of a triangle or a quadrilateral, and the two second sub-pixels in the pixel unit are symmetrically distributed. In an embodiment, the two second sub-pixels are connected to each other by a sharing edge to form the second sub-pixel unit in a shape of a triangle or a quadrilateral.

In an embodiment, the first sub-pixel and the third sub-pixel in the pixel unit are symmetrically distributed with respect to the second sub-pixel unit.

In an embodiment, the first sub-pixel, the second sub-pixel, and the third sub-pixel are in a shape of a right triangle with a same shape and area.

In an embodiment, the first sub-pixel, the second sub-pixel, and the third sub-pixel are in a shape of an isosceles right triangle with a same shape and area, and the two second sub-pixels in the pixel unit are symmetrically distributed.

In an embodiment, same sub-pixels are configured to have a sharing edge to form the pixel structure including a plurality of first sub-pixel groups, a plurality of second sub-pixel groups, and a plurality of third sub-pixel groups; a first sub-pixel group is formed by splicing two first sub-pixels, a second sub-pixel group is formed by splicing four second sub-pixels, and a third sub-pixel group is formed by splicing two third sub-pixels.

In an embodiment, same sub-pixel are configured to have a sharing edge to form the pixel structure including a plurality of first sub-pixel groups, a plurality of second sub-pixel groups, and a plurality of third sub-pixel groups; a first sub-pixel group is formed by splicing four first sub-pixels, a second sub-pixel group is formed by splicing four second sub-pixels, and a third sub-pixel group is formed by splicing four third sub-pixels.

In an embodiment, the first sub-pixel and the third sub-pixel are in a shape of a right triangle with a same shape and area; the two second sub-pixels are in a shape of a quadrilateral with a same shape and area, the second sub-pixel unit is in a shape of the quadrilateral.

In an embodiment, the first sub-pixel group is a red sub-pixel group formed by connecting two red sub-pixels; the second sub-pixel group is a green sub-pixel group formed by connecting four green sub-pixels; the third sub-pixel group is a blue sub-pixel group formed by connecting two blue sub-pixels.

In an embodiment, the first sub-pixel group is a red sub-pixel group formed by connecting four red sub-pixels; the second sub-pixel group is a green sub-pixel group formed by connecting four green sub-pixels; the third sub-pixel group is a blue sub-pixel group formed by connecting four blue sub-pixels.

In an embodiment, the pixel structure further includes a first pixel limiting layer configured to separate adjacent sub-pixel groups with different colors and a second pixel limiting layer configured to separate adjacent sub-pixels with a same color.

A display panel is provided, which includes the pixel structure of any one of the above-mentioned embodiments.

In the above-mentioned pixel structure and display panel, there are a plurality of pixel units in the pixel structure, each pixel unit is in the shape of a rectangle. The pixel unit includes four sub-pixels, respectively one first sub-pixel, two second sub-pixels, and one third sub-pixel. The two second sub-pixels are spliced to form one second sub-pixel unit; the first sub-pixel and the third sub-pixel are respectively provided on opposite sides of the second sub-pixel unit. That is, the ratio of the number of the first sub-pixel to the number of the second sub-pixels to the number of the third sub-pixels is equal to 1:2:1, to ensure that the first sub-pixel and the third sub-pixel are sharing sub-pixels, such that the minimum pixel unit can form two display pixel units, thereby the resolution is improved.

DETAILED DESCRIPTION

In order to make the purpose, technical solutions, and advantages of the present disclosure clearer, the disclosure will be detailed below with reference to the accompanying drawings and embodiments. It should be appreciated that the specific embodiments described here are merely used for explaining the present disclosure, and not to limit the disclosure.

In an embodiment of the present disclosure, a pixel structure is provided. The pixel is the most basic unit that makes up an image, and the pixel structure is a structure consisting of multiple color sub-pixels arranged in designated positions and is configured to determine the displayed image. The color sub-pixel generally includes three primary colors, namely red, green and blue, and are represented by R (red sub-pixel), G (green sub-pixel), and B (blue sub-pixel), respectively.

Figure 1:
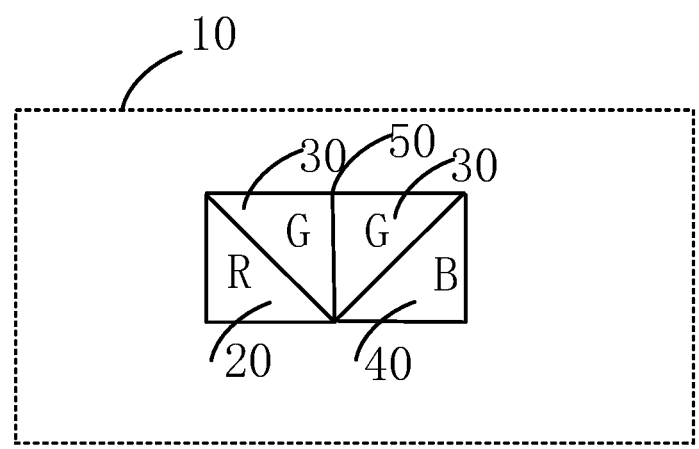
FIG. 1 is a schematic structure diagram of a pixel unit according to an embodiment of the present disclosure.
Figure 2:
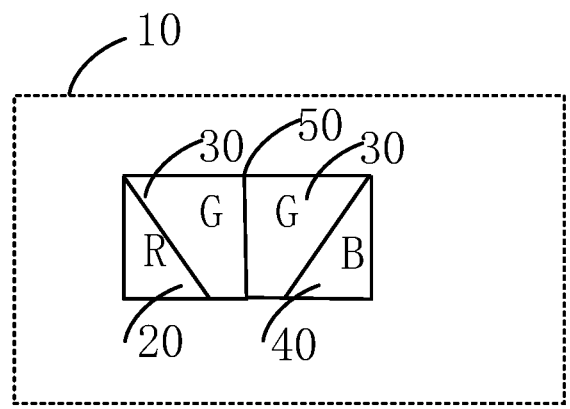
FIG. 2 is a schematic structure diagram of a pixel unit according to another embodiment of the present disclosure.

Referring to FIGS. 1 to 2, the pixel structure can include a number of pixel units 10, and a shape of each pixel unit 10 is rectangular. Each pixel unit 10 can include four sub-pixels, for example, one first sub-pixel 20, two second sub-pixels 30, and one third sub-pixel 40, respectively. The two second sub-pixels 30 have a sharing edge and are connected by the sharing edge to form a second sub-pixel unit 50. The first sub-pixel 20 and the third sub-pixel 40 are respectively arranged on opposite sides of the second sub-pixel unit 50. The sub-pixels having a sharing edge refers to that the two second sub-pixels are well connected, that is, the same edges of the two sub-pixels are overlapped and connected. If a pixel limiting layer is provided between the sub-pixels, the two sub-pixels having a sharing edge should maintain the same direction and angle to connect to the pixel limiting layer, that is, the two sub-pixels can remain in a state of having the sharing-edge when the pixel limiting layer is eliminated.

On the premise that the one first sub-pixel 20, the two second sub-pixels 30 and the one third sub-pixel 40 can be spliced to form a rectangular pixel unit 10, the first sub-pixel 20, the second sub-pixel 30 and the third sub-pixel 40 can have any shape and any area size; and the second sub-pixels 30 in the second sub-pixel unit 50 can also have any shape and any area size. The aforementioned sub-pixels can have any shape and any area size, that is, the sub-pixels can have the same shape and area, or can have different shapes and/or areas. For example, the first sub-pixel 20, the second sub-pixel 30, and the third sub-pixel 40 can all have any shape of a triangle, a right-angled triangle, and an isosceles right-angled triangle; or the first sub-pixel 20 is triangular; or the second sub-pixel 30 is triangular or a quadrilateral; or the third sub-pixel 40 is triangular, as long as the sub-pixels can be spliced to form the rectangular pixel unit 10. If the second sub-pixel unit 50 is triangular, the two second sub-pixels 30 can both be triangular, or one second sub-pixel is triangular, and the other second sub-pixel is a quadrilateral. Alternatively, if the second sub-pixel unit 50 is quadrilateral, the two second sub-pixels 30 can both be quadrilateral; and the first sub-pixel 20 and the third sub-pixel 40 are respectively arranged on opposite sides of the second sub-pixel unit 50. The first sub-pixel 20 and the third sub-pixel 40 can be respectively arranged on left and right opposite sides of the second sub-pixel unit 50, or arranged on up and down opposite sides of the second sub-pixel unit 50. The first sub-pixel 20 and the third sub-pixel 40 can also be symmetrically distributed on both sides of the second sub-pixel unit 50.

Further, the first sub-pixel 20, the second sub-pixel 30, and the third sub-pixel 40 can respectively be the red sub-pixel R, the green sub-pixel G, and the blue sub-pixel B. For example, if the first sub-pixel 20 is the red sub-pixel R, the second sub-pixel 30 and the third sub-pixel 40 are respectively the green sub-pixel G and the blue sub-pixel B, that is, the second sub-pixel 30 is, m the green sub-pixel G and the third sub-pixel 40 is the blue sub-pixel B; or the second sub-pixel 30 is the blue sub-pixel B, and the third sub-pixel 40 is the green sub-pixel G.

Each pixel unit 10 in the pixel structure can include one first sub-pixel 20, two second sub-pixels 30, and one third sub-pixel 40. The two second sub-pixels 30 are spliced to form one second sub-pixel unit 50, and the first sub-pixel 20 and the third sub-pixel 40 are respectively arranged on opposite sides of the second sub-pixel unit 50. That is, a ratio of the number of the first sub-pixels 20 to the number of the second sub-pixels 30 to the number of the third sub-pixels 40 is equal to 1:2:1, to ensure that the first sub-pixel 20 and the third sub-pixel 40 are sharing sub-pixels, so that a minimum pixel unit can form two display pixel units, that is, one minimum pixel unit RGGB can form two display pixel units RGB, thereby improving the resolution.

In an embodiment, in the pixel unit 10, one first sub-pixel 20, one third sub-pixel 40, and two second sub-pixels 30 are arranged in a row, that is, one first sub-pixel 20, one third sub-pixel 40 and one second sub-pixel unit 50 are arranged in a row. The shapes of the first sub-pixel 20 and the third sub-pixel 20 are both triangular, and the two right angles on the same long side in the rectangular pixel unit 10 are respectively an angle between two sides of the first sub-pixel 20 and an angle between two sides of the third sub-pixel 40. In other words, the first sub-pixel 20 and the third sub-pixel 40 can be in the shape of the right triangle or isosceles right triangle.

If the pixel unit 10 is rotated by 90 degrees, one first sub-pixel 20, one third sub-pixel 40, and two second sub-pixels 30 can be arranged in a row, that is, one first sub-pixel 20, one third sub-pixel 40 and a second sub-pixel unit 50 are arranged in a row.

Moreover, in an embodiment, the first sub-pixel 20 is a red sub-pixel R, the second sub-pixel 30 is a green sub-pixel G, and the third sub-pixel 40 is a blue sub-pixel B. Since the second sub-pixel unit 50 includes two second sub-pixels 30, that is, the second sub-pixel unit 50 includes two green sub-pixels G.

Further, as shown in FIG. 1, in this embodiment, the first sub-pixel 20, the third sub-pixel 40, and the two second sub-pixels 30 in the second sub-pixel unit 50 are all in the shape of an isosceles right triangle with the same shape and area.

Specifically, in the pixel unit 10, two second sub-pixels 30 in the second sub-pixel unit 50 are symmetrically connected to each other to form the second sub-pixel unit 50 in the shape of the isosceles right triangle. Moreover, since the second sub-pixel unit 50 is provided between the first sub-pixel 20 and the third sub-pixel 40, one second sub-pixel 30 in the second sub-pixel unit 50 is provided between the other second sub-pixel 30 and the first sub-pixel 30, or between the other second sub-pixel 30 and third sub-pixel 40. In other words, the second sub-pixel unit 50 is provided between the first sub-pixel 20 and the third sub-pixel 40, and the two second sub-pixels 30 in the second sub-pixel unit 50 are laterally symmetrically arranged, i.e., the two second sub-pixels 30 are connected in a left-right symmetric manner to form the second sub-pixel unit 50, that is, the overlapped and connected sides of the two second sub-pixels 30 are in a shape of "1". The overlapped and connected sides are an angle bisector of a top angle in the second sub-pixel unit 50, which is configured to obtain the two second sub-pixels 30 by bisection.

In other words, the red sub-pixel R corresponding to the first sub-pixel 20 is connected to one of the two green sub-pixels G corresponding to the second sub-pixel unit 50, and the blue sub-pixel B corresponding to the third sub-pixel 40 is connected to the other of the two green sub-pixels G corresponding to the second sub-pixel unit 50, that is, the red sub-pixel R is connected to one of the two green sub-pixels G, the blue sub-pixel B is connected to the other green sub-pixel G, and the red sub-pixel R and the blue sub-pixel B are symmetrically distributed with respect to the green sub-pixels G.

In addition, as shown in FIG. 2, in this embodiment, the first sub-pixel 20 and the third sub-pixel 40 are both in the shape of right triangle with the same shape and area, and the two second sub-pixels in the second sub-pixel unit 50 30 are in a shape of quadrilateral with the same shape and area.

Specifically, the two second sub-pixels 30 in the second sub-pixel unit 50 are symmetrically connected to form the second sub-pixel unit 50 in a shape of an isosceles trapezoid; and since the second sub-pixel unit 50 is provided between the first sub-pixel 20 and the third sub-pixels 40, one of the second sub-pixels 30 in the second sub-pixel unit 50 is provided between the other second sub-pixel 30 and the first sub-pixel 20, or between the other second sub-pixel 30 and the third sub-pixel 40. In other words, the second sub-pixel unit 50 is provided between the first sub-pixel 20 and the third sub-pixel 40, and the two second sub-pixels 30 in the second sub-pixel unit 50 are laterally symmetrically arranged, i.e., the two second sub-pixels 30 are connected in the left-right symmetric manner to form the second sub-pixel unit 50, that is, the overlapped and connected sides of the two second sub-pixels 30 are in the shape of "1". The overlapped and connected sides are a connecting line between midpoints of the upper and lower bottom edges of the second sub-pixel unit 50, which is configured to obtain the two second sub-pixels 30 by bisection.

In other words, the red sub-pixel R corresponding to the first sub-pixel 20 is connected to one of the two green sub-pixels G corresponding to the second sub-pixel unit 50, and the blue sub-pixel B corresponding to the third sub-pixel 40 is connected to the other of the two green sub-pixels G corresponding to the second sub-pixel unit 50, that is, the red sub-pixel R is connected to one of the two green sub-pixels G, the blue sub-pixel B is connected to the other green sub-pixel G; the red sub-pixel R and the blue sub-pixel B are symmetrically distributed with respect to the green sub-pixels G.

In an embodiment, one red sub-pixel, two green sub-pixels, and one blue sub-pixel are designed to form the minimum pixel unit in the form of RGGB; and the red sub-pixel and the blue sub-pixel each form a display pixel unit with one green sub-pixel. The display pixel unit is referred to as a sharing sub-pixel unit. The minimum pixel unit in the form of RGGB is formed with the two green sub-pixel units, so that the minimum pixel unit can be divided into two display pixel units. Compared to the conventional minimum pixel unit in a form of RGB with only one display pixel unit, the resolution of the pixel structure is significantly improved.

Figure 3:
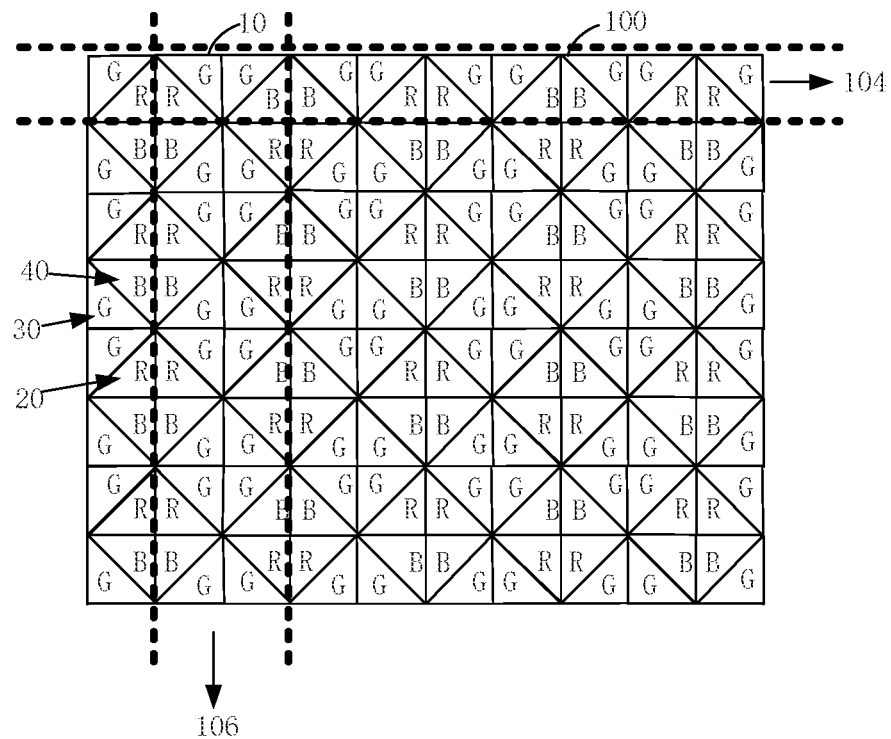
FIG. 3 is a schematic diagram illustrating a pixel structure according to an embodiment I of the present disclosure.

Referring to FIG. 3, the pixel units 10 can be repeatedly arranged to form a pixel row 104 in a first direction. In each pixel row 104, any two adjacent pixel units 10 can be connected by the same sub-pixel, and the adjacent same sub-pixels can be connected by a sharing edge.

The pixel units 10 can be repeatedly arranged to form a pixel column 106 in a second direction. In each pixel column 106, a second sub-pixel unit 50 in any pixel unit 10 and a second sub-pixel unit 50 in an adjacent pixel unit 10 can be connected by a sharing edge.

In some embodiments, a first sub-pixel 20 in any pixel unit 10 and a third sub-pixel 40 in an adjacent pixel unit 10 are connected by a sharing edge in the second direction. With referring to FIG. 4, in other embodiments, a first sub-pixel 20 in any pixel unit 10 and a first sub-pixel 20 in an adjacent pixel unit 10 are connected by a sharing edge; and a third sub-pixel 40 in any pixel unit 10 and a third sub-pixel 40 in an adjacent pixel unit 10 are connected by a sharing edge.

The first direction is any one of transverse direction and longitudinal direction, and the second direction is the other of the transverse direction and the longitudinal direction. The first direction is the transverse direction while the second direction is the longitudinal direction; the first direction is the longitudinal direction while the second direction is the transverse direction. When the adjacent sub-pixels in the pixel row 104 are the same and connected by a sharing edge, the pixel units 10 to which the two adjacent sub-pixels belong are symmetrically arranged based on the sub-pixels having a sharing edge.

The pixel structure 100 can include pixel rows 104 and pixel columns 106, that is, the pixel structure 100 consists of multiple pixel rows 104 and multiple pixel columns 106.

In the embodiment shown in FIG. 3, the first direction is the transverse direction, and the second direction is the longitudinal direction. Each sub-pixel is in the shape of a right triangle with the same shape and area, that is, the second sub-pixel unit is also in the shape of a right triangle.

In the transverse direction, pixel units 10 are repeatedly arranged to form a pixel row 104; and in each pixel row 104, as for adjacent pixel units 10, a first sub-pixel 20 of one pixel unit 10 is connected to a first sub-pixel 20 of the other pixel unit 10 by a sharing edge; or a third sub-pixel 40 of one pixel unit 10 is connected to a third sub-pixel 40 of the other pixel unit 10 by a sharing edge. In addition, the second sub-pixel units in the pixel row are symmetrically arranged.

In the longitudinal direction, the pixel units 10 are repeatedly arranged to form a pixel column 106; and in each pixel column 106, as for adjacent pixel units 10, a first sub-pixel 20 of one pixel unit 10 is connected to a third sub-pixel 40 of the other pixel unit 10 by a sharing edge; a third sub-pixel 40 of one pixel unit 10 is connected to a first sub-pixel 20 of the other pixel unit 10 by a sharing edge; and the second sub-pixel units 50 in the two adjacent pixel units 10 are symmetrically arranged.

A second sub-pixel unit 50 of one pixel unit 10 is connected to a second sub-pixel unit 50 of the other pixel unit 10 by a sharing edge; and a first sub-pixel 20 of one of the two adjacent first sub-pixel units 10 is symmetrical to a third sub-pixel 40 of the other pixel unit 10; and a third sub-pixel 40 of one of the two adjacent pixel units 10 is symmetrical to a first sub-pixel 20 of the other pixel unit 10.

Specifically, in the transverse direction, a red sub-pixel R and a red sub-pixel R in each pixel row 104 are connected to each other by a sharing edge; a blue sub-pixel B and a blue sub-pixel B are connected to each other by a sharing edge; and a green sub-pixel and a green pixel G in each pixel unit 10 are connected to each other by a sharing edge. In addition, the green sub-pixels G in adjacent pixel units are symmetrically arranged. In the longitudinal direction, in each pixel column 106, a red sub-pixel R and a blue sub-pixel B are connected to each other by a sharing edge; a blue sub-pixel B and a red sub-pixel R are connected to each other by a sharing edge. Or, in adjacent pixel units 10, the second sub-pixel units 50 in two pixel units 10 are connected to each other by a sharing edge. For example, in the pixel column 106, a second sub-pixel unit 50 in any pixel unit 10 is connected to a second sub-pixel unit 50 in an adjacent pixel unit 10 by a sharing edge, that is, a green sub-pixel G is connected to a green pixel G by a sharing edge.

Figure 4:
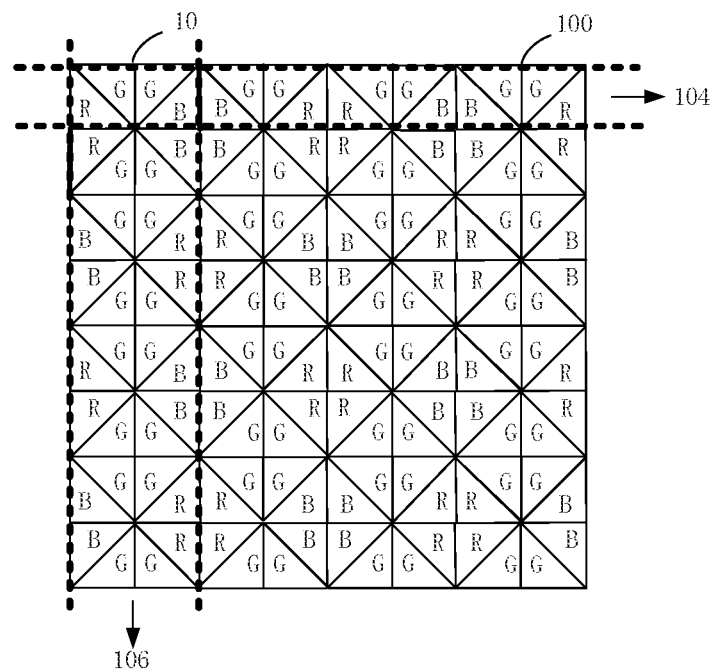
FIG. 4 is a schematic diagram illustrating a pixel structure according to an embodiment II of the present disclosure.

In an embodiment shown in FIG. 4, the first direction is the transverse direction, and the second direction is the longitudinal direction. Each sub-pixel is in a shape of a right triangle with the same shape and area, that is, the second sub-pixel unit is also in a shape of a right triangle.

In the transverse direction, the pixel units 10 are repeatedly arranged to form a pixel row 104; and in each pixel row 104, as for adjacent pixel units 10, a first sub-pixel 20 of one pixel unit 10 is connected to a first sub-pixel 20 of the other pixel unit 10 by a sharing edge; or, a third sub-pixel 40 of one pixel unit 10 is connected to a third sub-pixel 40 of the other pixel unit 10 by a sharing edge. In addition, the second sub-pixel units 50 in the pixel unit 10 are symmetrically arranged.

In the longitudinal direction, the pixel units 10 are repeatedly arranged to form a pixel column 106; and in each pixel column 106, as for adjacent pixel units 10, a first sub-pixel 20 of one pixel unit 10 is connected to a first sub-pixel 20 of the other pixel unit by a sharing edge; and a third sub-pixel 40 of one pixel unit 10 is connected to a third sub-pixel 40 of the other pixel unit 10 by a sharing edge; and the second sub-pixel units 50 in two adjacent pixel units 10 are symmetrically arranged.

Alternatively, a second sub-pixel unit 50 of one of the two adjacent pixel units 10 is connected to a second sub-pixel unit 50 of the other pixel unit 10 by a sharing edge. In addition, the first sub-pixel and the third sub-pixel in two adjacent pixel units are symmetrically arranged.

Specifically, in the transverse direction and in each pixel row 104, a red sub-pixel R is connected to a red sub-pixel R by a sharing edge, a blue sub-pixel B is connected to a blue sub-pixel B by a sharing edge, and a green sub-pixel in each pixel unit 10 is connected to a green pixel G by a sharing edge. In addition, the green sub-pixels G in each adjacent pixel unit are symmetrically arranged. In the longitudinal direction and in each pixel column 106, a red sub-pixel R is also connected to a red sub-pixel R by a sharing edge, and a blue sub-pixel B is also connected to a blue sub-pixel B by a sharing edge. Alternatively, in adjacent pixel units 10, the second sub-pixel units 50 of two pixel units 10 are connected to each other by a sharing edge, that is, the green sub-pixel G is connected to the green sub-pixel G by a sharing edge.

Figure 5:
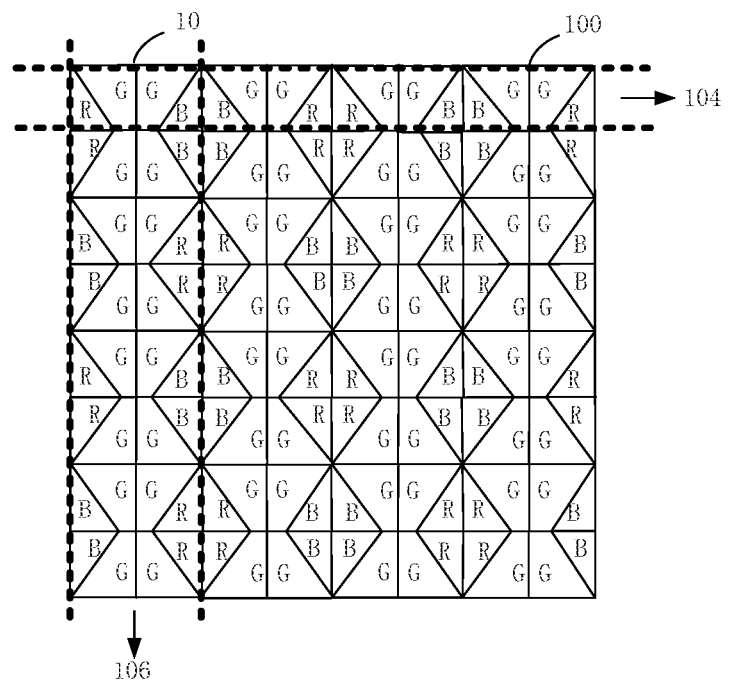
FIG. 5 is a schematic diagram illustrating a pixel structure according to an embodiment III of the present disclosure.

Referring to FIG. 5, in some embodiments, the first sub-pixel 20 and the third sub-pixel 40 are in the shape of a right triangle with the same shape and area; the two second sub-pixels 30 are in the shape of a quadrilateral with the same shape and area, that is, the second sub-pixel unit 50 is in a shape of an isosceles trapezoid. In an embodiment shown in FIG. 5, the first direction is the transverse direction, and the second direction is the longitudinal direction.

In the transverse direction, the pixel units 10 are repeatedly arranged to form a pixel row 104; and in each pixel row 104, as for adjacent pixel units 10, a first sub-pixel 20 of one pixel unit 10 is connected to a first sub-pixel 20 of the other pixel unit 10 by a sharing edge; or, a third sub-pixel 40 of one pixel unit 10 is connected to a third sub-pixel 40 of the other pixel unit 10 by a sharing edge. Moreover, the second sub-pixel units in the two adjacent pixel units 10 are symmetrically arranged.

In the longitudinal direction, the pixel units 10 are repeatedly arranged to form a pixel column 106; and in each pixel column 106, as for adjacent pixel units 10, a first sub-pixel 20 of one pixel unit 10 is connected to a first sub-pixel 20 of the other pixel unit 10 by a sharing edge; a third sub-pixel 40 of one pixel unit 10 is connected to a third sub-pixel 40 of the other pixel unit 10 by a sharing edge; and the second sub-pixels of the two adjacent pixel units are symmetrically arranged.

Alternatively, a second sub-pixel unit 50 of one pixel unit 10 is connected to a second sub-pixel unit 50 of the other pixel unit 10 by a sharing edge. In addition, the first sub-pixel and the third sub-pixel of two adjacent pixel units are symmetrically arranged. Since each sub-pixel is in a shape of a right triangle with the same shape and area, intersecting on one edge means that the two sub-pixels are overlapped on and connected by the same edge.

Specifically, in the transverse direction and in each pixel row 104, a red sub-pixel R is connected to a red sub-pixel R by a sharing edge, a blue sub-pixel B is connected to a blue sub-pixel B by a sharing edge, and a green sub-pixel G in each pixel unit 10 is connected to a green sub-pixel G by a sharing edge. In the longitudinal direction and in each pixel column 106, a red sub-pixel R is also connected to a red sub-pixel R by a sharing edge, a blue sub-pixel B is also connected to a blue sub-pixel B by a sharing edge, and the second sub-pixel units 50 of the two pixel units 10 are connected to each other by a sharing edge, that is, the green sub-pixel G is connected to the green sub-pixel G by a sharing edge.

Figure 6:
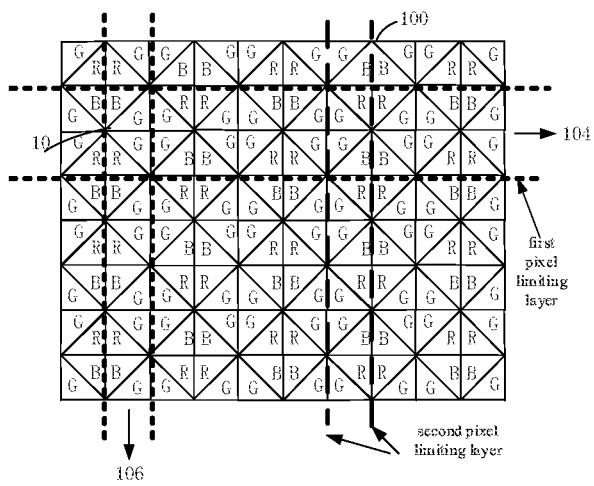
FIG. 6 is a schematic diagram illustrating a pixel structure according to an embodiment IV of the present disclosure.
Figure 7:
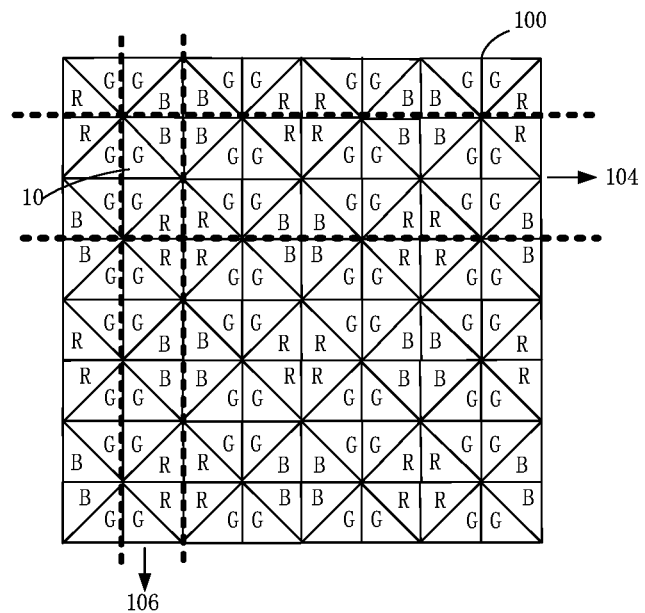
FIG. 7 is a schematic diagram illustrating a pixel structure according to an embodiment V of the present disclosure.
Figure 8:
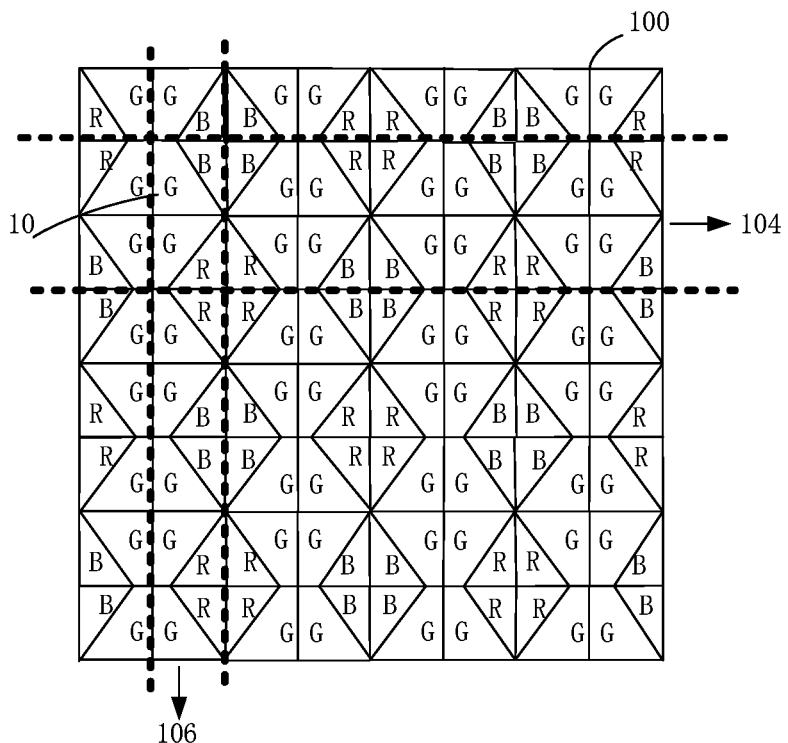
FIG. 8 is a schematic diagram illustrating a pixel structure according to an embodiment VI of the present disclosure.

Referring to FIGS. 6-8, in some embodiments, the pixel structure 100 includes pixel rows 104 and pixel columns 106, that is, the pixel structure 100 consists of a plurality of pixel rows 104 and a plurality of pixel columns 106. The sub-pixels are arranged in a row, that is, arranged in a straight line in a longitudinal direction.

In an embodiment shown in FIG. 6, each sub-pixel is in a shape of a right triangle with the same shape and area, that is, the second sub-pixel unit is also in a shape of a right triangle.

In the transverse direction, the pixel units 10 are repeatedly arranged to form a pixel row 104; and in each pixel row 104, as for adjacent pixel units 10, a first sub-pixel 20 of one pixel unit 10 is connected to a first sub-pixel 20 of the other pixel unit 10 by a sharing edge; a third sub-pixel 40 of one pixel unit 10 is connected to a third sub-pixel 40 of the other pixel unit 10 by a sharing edge; and the second sub-pixel units are symmetrically arranged. Alternatively, a second sub-pixel unit 50 of one pixel unit 10 is connected to a second sub-pixel unit 50 of the other pixel unit 10 by a sharing edge, and the first sub-pixel and the second sub-pixel in the adjacent pixel units are symmetrically arranged.

In the longitudinal direction, the pixel units 10 are repeatedly arranged to form a pixel column 106; and in each pixel column 106, as for adjacent pixel units 10, a first sub-pixel 20 of one pixel unit 10 is connected to a third sub-pixel of the other pixel unit 10 by a sharing edge; or, a third sub-pixel 40 of one pixel unit 10 is connected to a first sub-pixel 20 of the other pixel unit 10 by a sharing edge. In addition, the second sub-pixels in adjacent pixel units are symmetrically arranged.

Specifically, in each pixel row 104, a red sub-pixel R is connected to a red sub-pixel R by a sharing edge, a blue sub-pixel B is connected to a blue sub-pixel B by a sharing edge, or a green sub-pixel G in each pixel unit 10 is connected to a green sub-pixel G by a sharing edge. In the longitudinal direction and in each pixel column 106, a red sub-pixel R is connected to a blue sub-pixel B by a sharing edge, and a blue sub-pixel B is also connected to a red sub-pixel R by a sharing edge.

In an embodiment shown in FIG. 7, each sub-pixel is in a shape of a right triangle with the same shape and area, that is, the second sub-pixel unit is also in a shape of a right triangle.

In the transverse direction, the pixel units 10 are repeatedly arranged to form pixel rows 104; and in each pixel row 104, as for adjacent pixel units 10, a first sub-pixel 20 of one pixel unit 10 is connected to a first sub-pixel 20 of the other pixel unit 10 by a sharing edge, a third sub-pixel 40 of one pixel unit 10 is connected to a third sub-pixel 40 of the other pixel unit 10 by a sharing edge; and the second sub-pixels of adjacent pixel units are symmetrically arranged. Alternatively, a second sub-pixel unit 50 of one pixel unit 10 is connected to a second sub-pixel unit 50 of the other pixel unit 10 by a sharing edge, and the first sub-pixel and the third sub-pixel in adjacent pixel units are symmetrically arranged.

In the longitudinal direction, the pixel units 10 are repeatedly arranged to form pixel columns 106; and in each pixel column 106, as for adjacent pixel units 10, a first sub-pixel 20 of one pixel unit 10 is connected to a first sub-pixel 20 of the other pixel unit 10 by a sharing edge; or, a third sub-pixel 40 of one pixel unit 10 is connected to a third sub-pixel 40 of the other pixel unit 10 by a sharing edge. In addition, the second sub-pixels of adjacent pixel units are symmetrically arranged.

Specifically, in each pixel row 104, a red sub-pixel R is connected to a red sub-pixel R by a sharing edge, a blue sub-pixel B is connected to a blue sub-pixel B by a sharing edge, or a green sub-pixel G in each pixel unit 10 is connected to a green sub-pixel G by a sharing edge. In the longitudinal direction and in each pixel column 106, a red sub-pixel R is connected to a red sub-pixel R by a sharing edge, and a blue sub-pixel B is also connected to a blue sub-pixel B by a sharing edge.

In an embodiment shown in FIG. 8, the first sub-pixel 20 and the third sub-pixel 40 are in the shape of a right triangle with the same shape and area; and two second sub-pixels 30 are in the shape of a quadrilateral with the same shape and area, that is, the second sub-pixel unit 50 is in the shape of a quadrilateral.

The pixel units 10 are repeatedly arranged to form pixel rows 104; and in each pixel row 104, as for adjacent pixel units 10, a first sub-pixel 20 of one pixel unit 10 is connected to a first sub-pixel 20 of the other pixel unit 10 by a sharing edge, a third sub-pixel 40 of one pixel unit 10 is connected to a third sub-pixel 40 of the other pixel unit 10 by a sharing edge; and the second sub-pixels of adjacent pixel units are symmetrically arranged. Alternatively, a second sub-pixel unit 50 of one pixel unit 10 is connected to a second sub-pixel unit 50 of the other pixel unit 10 by a sharing edge; and the first sub-pixel and the third sub-pixel in adjacent pixel unit are symmetrically arranged.

In the longitudinal direction, the pixel units 10 are repeatedly arranged to form pixel columns 106; and in each pixel column 106, as for adjacent pixel units 10, a first sub-pixel 20 of one pixel unit 10 is connected to a first sub-pixel 20 of the other pixel unit 10 by a sharing edge; or, a third sub-pixel 40 of one pixel unit 10 is connected to a third sub-pixel 40 of the other pixel unit 10 by a sharing edge; and the second sub-pixels of adjacent pixel units are symmetrically arranged.

Specifically, in each pixel row 104, a red sub-pixel R is connected to a red sub-pixel R by a sharing edge, and a blue sub-pixel B is connected to a blue sub-pixel B by a sharing edge; or, a green sub-pixel G in each pixel unit 10 is connected to a green sub-pixel G by a sharing edge. In the longitudinal direction and in each pixel column 106, a red sub-pixel R is connected to a red sub-pixel R by a sharing edge, and a blue sub-pixel B is also connected to a blue sub-pixel B by a sharing edge.

Figure 9:
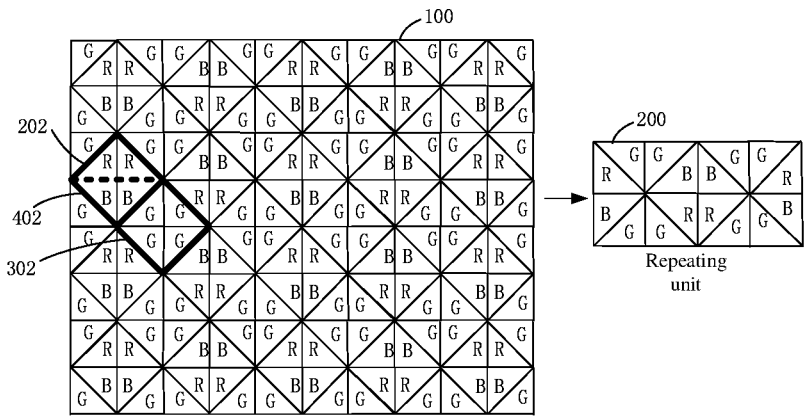
FIG. 9 is a schematic diagram illustrating a pixel structure according to an embodiment VII of the present disclosure.

Referring to FIG. 9, in an embodiment, in two adjacent pixel units 10, two first sub-pixels 20 are arranged to respectively have a sharing edge with two third sub-pixels 40. Four pixel units 10 are arranged in two rows and two columns to form a repeating unit 200. The repeating unit 200 is repeatedly arranged on the pixel row 104 and the pixel column 106 to form the pixel structure 100. In the repeating unit 200, a first pixel row includes a first sub-pixel 20, a second sub-pixel unit 50, a third sub-pixel 40, a third sub-pixel 40, a second sub-pixel unit 50, and a first sub-pixel 20 which are sequentially arranged along a pixel row direction. A second pixel row includes a third sub-pixel 40, a second sub-pixel unit 50, a first sub-pixel 20, a first sub-pixel 20, a second sub-pixel unit 50, and a third sub-pixel 40 which are sequentially arranged along the pixel row direction. Moreover, in this embodiment, in adjacent pixel units 10, the same sub-pixels are spliced together to form the pixel structure 100 including a plurality of first sub-pixel groups 202, a plurality of second sub-pixel groups 302, and a plurality of third sub-pixel groups 402. The first sub-pixel group 202 is formed by splicing two first sub-pixels 20; the second sub-pixel group 302 is formed by splicing four second sub-pixels 30; and the third sub-pixel group 402 is formed by splicing two third sub-pixels 40.

The first sub-pixel 20, the second sub-pixel 30, and the third sub-pixel 40 can be a red sub-pixel, a green sub-pixel, and a blue sub-pixel, respectively. The first sub-pixel group 202, the second sub-pixel group 302, and the third sub-pixel group 402 can be a red sub-pixel group 202, a green sub-pixel group 302, and a blue sub-pixel group 402, respectively.

The pixel structure 100 can include a plurality of red sub-pixel groups 202, a plurality of green sub-pixel groups 302, and a plurality of blue sub-pixel groups 402. Each red sub-pixel group 202 is formed by connecting two red sub-pixels R; each green sub-pixel group 302 is formed by connecting four green sub-pixels G; each blue sub-pixel group 402 is formed by connecting two blue sub-pixels B. The red sub-pixel group 202, the green sub-pixel group 302, and the blue sub-pixel group 402 can share one opening in an evaporation technology, and the opening can be used as an ink deposition region in a printing technology.

In some embodiments, the red sub-pixel group 202 and the blue sub-pixel group 402 are in a shape of a triangle with the same shape and area; and the green sub-pixel group 302 is in a shape of a quadrangle, and an area of the quadrangle is twice that of the triangle. That is, the area of the green sub-pixel group 302 is twice that of the red sub-pixel group 202 or the blue sub-pixel group 402, which is equal to the area of the red sub-pixel group 202 plus the area of the blue sub-pixel group 402. The red sub-pixel group 202 is connected to the blue sub-pixel group 402 in an up-down symmetrical manner to form a quadrilateral having the same area and shape as the green sub-pixel group 302; and the green sub-pixel group 302 is connected to the quadrilateral formed by the red sub-pixel group 202 and blue sub-pixel group 402.

Figure 10:
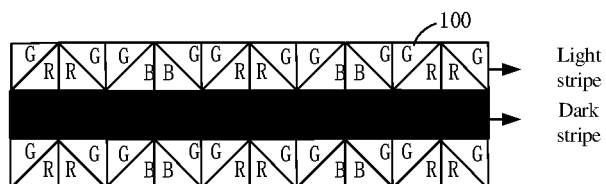
FIG. 10 is a test schematic diagram illustrating a pixel structure resolution test according to an embodiment of the present disclosure.
Figure 10:
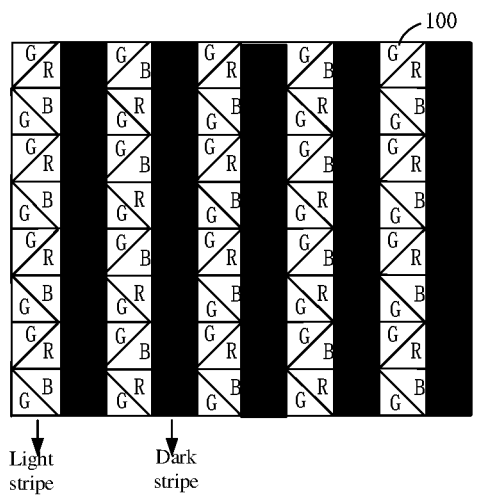

Since the red sub-pixel group 202 and the blue sub-pixel group 402 in the pixel structure 100 are formed by connecting two sub-pixels of the same color; and the green sub-pixel group 302 is formed by connecting four sub-pixels of the same color, such that the repeating unit as shown in FIG. 9 is formed in the pixel structure 100. The actual production of the pixel structure 100 is equivalent to dividing one complete color sub-pixel into two or four color sub-pixels with the same area, that is, two sub-pixels and four sub-pixels are respectively manufactured in the same pixel area. In the same area, the number of sub-pixels is increased and an area of a sub-pixel is reduced, such that the area of the pixel becomes smaller, thereby improving the resolution. In this embodiment, as shown in FIG. 10, after a resolution test, the pixel structure 100 in this embodiment can form smooth transverse light and dark stripes and longitudinal light and dark stripes. Compared to the conventional pixel structure with one RGB unit to display, the transverse resolution can be increased twice, and the longitudinal resolution can be increased four times.

Figure 11:
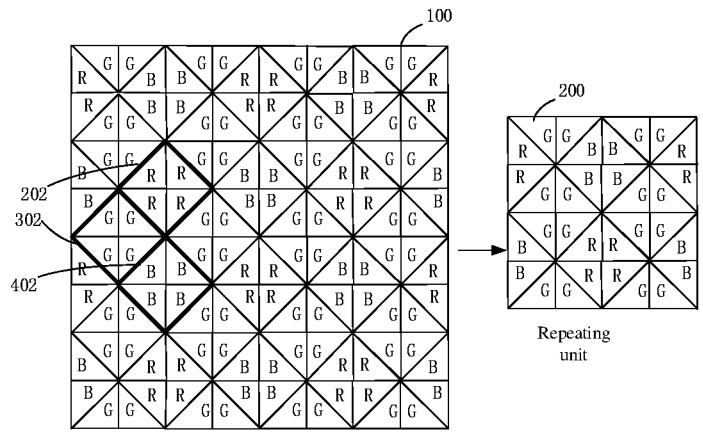
FIG. 11 is a schematic structure diagram of each sub-pixel group according to an embodiment VIII of the present disclosure.

Referring to FIG. 11, in an embodiment, in any two adjacent pixel units 10, two first sub-pixels 20 are connected by a sharing edge and two third sub-pixels are connected by a sharing edge; and eight pixel units are arranged in four rows and two columns to form the repeating unit 200. The repeating unit 200 is repeatedly arranged in the pixel row 104 and the pixel column 106 to form the pixel structure 100. In the repeating unit, the first pixel row includes a first sub-pixel 20, a second sub-pixel unit 50, a third sub-pixel 40, a third sub-pixel 40, a second sub-pixel unit 50, and a first sub-pixel 20 which are sequentially arranged along the pixel row direction. The second pixel row includes a first sub-pixel 20, a second sub-pixel unit 50, a third sub-pixel 40, a third sub-pixel 40, a second sub-pixel unit 50, and a first sub-pixel 20 which are sequentially arranged along the pixel row direction. The third pixel row includes a third sub-pixel 40, a second sub-pixel unit 50, a first sub-pixel 20, a first sub-pixel 20, a second sub-pixel unit 50, and a third sub-pixel 40 which are sequentially arranged along the pixel row direction. The fourth pixel row includes a third sub-pixel 40, a second sub-pixel unit 50, a first sub-pixel 20, a first sub-pixel 20, a second sub-pixel unit 50, and a third sub-pixel 40 which are sequentially arranged along the pixel row direction.

In this embodiment, in adjacent pixel units 10, the same sub-pixels are spliced together to form the pixel structure 100 including a plurality of first sub-pixel groups 202, a plurality of second sub-pixel groups 302, and a plurality of third sub-pixel groups 402. The first sub-pixel group 202 is formed by splicing four first sub-pixels 20; the second sub-pixel group 302 is formed by splicing two second sub-pixel 30; and the third sub-pixel group 402 is formed by splicing four third sub-pixels 40.

The first sub-pixel 20, the second sub-pixel 30, and the third sub-pixel 40 can be a red sub-pixel, a green sub-pixel, and a blue sub-pixel, respectively. The first sub-pixel group 202, the second sub-pixel group 302, and the third sub-pixel group 402 can be a red sub-pixel group 202, a green sub-pixel group 302, and a blue sub-pixel group 402, respectively.

The pixel structure 100 also includes a plurality of red sub-pixel groups 202, a plurality of green sub-pixel groups 302, and a plurality of blue sub-pixel groups 402. In an embodiment shown in FIG. 11, the green sub-pixel group 302 is formed by connecting four green sub-pixels G; the red sub-pixel group 202 is formed by connecting four red sub-pixels R; and the blue sub-pixel group 402 is formed by connecting four blue sub-pixels B. In a similar way, the red sub-pixel group 202, the green sub-pixel group 302, and the blue sub-pixel group 402 in this embodiment can share one opening in the evaporation technology, and the opening can be used as an ink deposition region in the printing technology.

Specifically, the red sub-pixel group 202, the blue sub-pixel group 402, and the green sub-pixel group 302 are in the shape of a quadrilateral with the same shape and area. The red sub-pixel group 202 is connected to the green sub-pixel group 302; the blue sub-pixel group 402 is connected to the green sub-pixel group 302; and the red sub-pixel group 202 and the blue sub-pixel group 402 are symmetrically distributed with respect to the green sub-pixel group 302.

Since the red sub-pixel group 202, the blue sub-pixel group 402, and the green sub-pixel group 302 in the pixel structure 100 are all formed by connecting four sub-pixels of the same color, the repeating unit as shown in FIG. 1 is formed in the pixel structure 100. Therefore, the actual production of the pixel structure 100 is equivalent to dividing one complete color sub-pixel into four color sub-pixels with the same area, that is, four sub-pixels are manufactured in the same pixel area; the number of sub-pixels is increased and an area of the sub-pixel is reduced under the same area, such that an area of the pixel becomes smaller, thereby improving the resolution.

Figure 12:
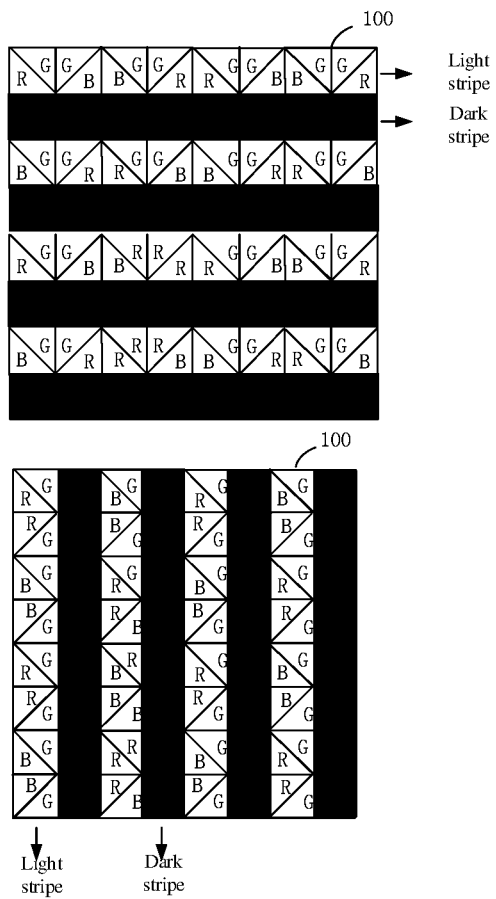
FIG. 12 is a test schematic diagram illustrating a pixel structure resolution test according to the other embodiment of the present disclosure.

In this embodiment, as shown in FIG. 12, after the resolution test, the pixel structure in this embodiment can form smooth transverse light and dark stripes and longitudinal light and dark stripes. Compared to the conventional pixel structure with one RGB unit to display, the transverse resolution can be increased four times, and the longitudinal resolution can also be increased four times.

Figure 13:
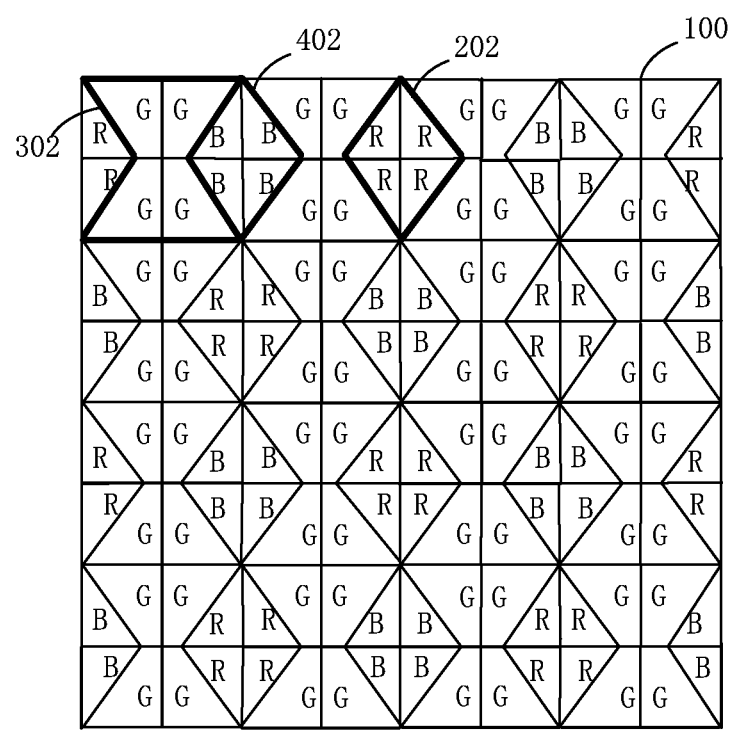
FIG. 13 is a schematic structure diagram of each sub-pixel group according to an embodiment IX of the present disclosure.

Referring to FIG. 13, in another embodiment, the first sub-pixel 20 and the third sub-pixel 40 are in the shape of a right triangle with the same shape and area, and two second sub-pixels 30 are in the shape of a quadrilateral with the same shape and area.

Similarly, the pixel structure 100 includes a plurality of first sub-pixel groups 202, a plurality of second sub-pixel groups 302, and a plurality of third sub-pixel groups 402. The green sub-pixel group 302 is formed by connecting four green sub-pixels G; the red sub-pixel group 202 is formed by connecting four red sub-pixels R; and the blue sub-pixel group 402 is formed by connecting four blue sub-pixels B.

In an embodiment, the pixel structure 100 further includes a first pixel limiting layer and a second pixel limiting layer. The red sub-pixel group, the green sub-pixel group, and the blue sub-pixel group are separated by the first pixel limiting layer; adjacent red sub-pixels as well as adjacent green sub-pixels as well as adjacent blue sub-pixels are separated by the second pixel limiting layer. The pixel limiting layer refers to a layer for separating each sub-pixel. In this embodiment, the first pixel limiting layer is configured to separate adjacent sub-pixel groups with different colors; the second pixel limiting layer is configured to separate adjacent sub-pixels having the same color. Furthermore, a height of the first pixel limiting layer in this embodiment is greater than that of the second pixel limiting layer.

Specifically, the first pixel limiting layer is provided between pixel groups of different colors and is configured to separate the pixel groups of different colors. That is, the red sub-pixel group 202 and the green sub-pixel group 302, as well as the red sub-pixel group 202 and the blue sub-pixel group 402, as well as the green sub-pixel group 302 and the blue sub-pixel group 402 are separated by the first pixel limiting layer. The adjacent red sub-pixels R, as well as the adjacent green sub-pixels G, as well as the adjacent blue sub-pixels B are separated by the second pixel limiting layer.

In an embodiment, a display panel is provided, and the display panel in this embodiment includes the pixel structure 100 described in any one of the above embodiments. The display panel with the pixel structure 100 in the present disclosure is designed with one red sub-pixel, two green sub-pixels and one blue sub-pixel, and the algorithm is combined to make the red sub-pixel and the blue sub-pixel as a sharing sub-pixel unit which forms the minimum pixel unit in the form of RGGB with two green sub-pixels, so that the minimum pixel unit can be divided into two display pixel units. Compared to the conventional display panel having the minimum pixel unit in the form of RGB with only one display pixel unit, the resolution of the display panel in this embodiment is significantly improved, thereby the display effect is improved.

The technical features of the above embodiments can be combined arbitrarily. In order to make the description concise, all possible combinations of the technical features in the above embodiments are not described. However, as long as there is no contradiction in the combinations of these technical features, these combinations all should be considered as in the scope of the present disclosure.

The above-mentioned embodiments are merely several exemplary embodiments of the present disclosure, and the description thereof is relatively specific and detailed, but it should not be understood as a limitation on the scope of the present disclosure. It should be pointed out that those of ordinary skill in the art can several transformations and improvements without departing from the concept of the present disclosure, and these all fall within the protection scope of the present disclosure. Therefore, the scope of protection of the present disclosure shall be subject to the appended claims.

What is claimed is:

1. A pixel structure, comprising:
   a plurality of pixel units;
   wherein each of the plurality of pixel units is in a shape of a rectangle;
   wherein the pixel unit comprises four sub-pixels, respectively one first sub-pixel, two second sub-pixels, and one third sub-pixel, the two second sub-pixels are connected by a sharing edge to form one second sub-pixel unit, the first sub-pixel and the third sub-pixel are respectively provided on opposite sides of the second sub-pixel unit;

wherein at least one of the two second sub-pixels is in a shape of a first quadrilateral, and the two second sub-pixels in the pixel unit are symmetrically distributed; and wherein in the pixel unit, the one first sub-pixel, the one third sub-pixel, and the two second sub-pixels are arranged in a row, the first sub-pixel and the third sub-pixel are both in a shape of a triangle, two right angles located on the same long side of the rectangle in the rectangular pixel unit are respectively an angle between two sides of the first sub-pixel and an angle between two sides of the third sub-pixel.

2. The pixel structure according to claim 1, wherein the pixel units are repeatedly arranged to form a pixel row in a first direction, and any two adjacent pixel units in each pixel row are connected to each other by same sub-pixels, and the adjacent same sub-pixels are connected by a sharing edge;

the pixel units are repeatedly arranged to form a pixel column in a second direction, and a second sub-pixel unit in any pixel unit in each pixel column is connected to a second sub-pixel unit in an adjacent pixel unit by a sharing edge.

3. The pixel structure according to claim 2, wherein in each pixel column and in the second direction, a first sub-pixel in any pixel unit is connected to a third sub-pixel in an adjacent pixel unit by a sharing edge.

4. The pixel structure according to claim 3, wherein,
four pixel units are arranged in two rows and two columns to form a repeating unit, the repeating unit is repeatedly arranged in the pixel row and the pixel column respectively to form the pixel structure, a first pixel row in the repeating unit comprises the first sub-pixel, the second sub-pixel unit, the third sub-pixel, the third sub-pixel, the second sub-pixel unit, and the first sub-pixel which are sequentially arranged along a pixel row direction; a second pixel row in the repeating unit comprises the third sub-pixel, the second sub-pixel unit, the first sub-pixel, the first sub-pixel, the second sub-pixel unit, and the third sub-pixel which are sequentially arranged along a pixel row direction.

5. The pixel structure according to claim 4, wherein same sub-pixels are configured to have a sharing edge to form the pixel structure comprising a plurality of first sub-pixel groups, a plurality of second sub-pixel groups, and a plurality of third sub-pixel groups; a first sub-pixel group is formed by splicing two first sub-pixels, a second sub-pixel group is formed by splicing four second sub-pixels, and a third sub-pixel group is formed by splicing two third sub-pixels.

6. The pixel structure according to claim 5, wherein the first sub-pixel group is a red sub-pixel group formed by connecting two red sub-pixels; the second sub-pixel group is a green sub-pixel group formed by connecting four green sub-pixels; the third sub-pixel group is a blue sub-pixel group formed by connecting two blue sub-pixels.

7. The pixel structure according to claim 2, wherein in each pixel column and in the second direction, a first sub-pixel in any pixel unit is connected to a first sub-pixel in an adjacent pixel unit by a sharing edge, and a third sub-pixel in any pixel unit is connected to a third sub-pixel in an adjacent pixel unit by a sharing edge.

8. The pixel structure according to claim 7, wherein,
eight pixel units are arranged in four rows and two columns to form a repeating unit, the repeating unit is repeatedly arranged in the pixel row and the pixel column respectively to form the pixel structure, a first pixel row in the repeating unit comprises the first sub-pixel, the second sub-pixel unit, the third sub-pixel, the third sub-pixel, the second sub-pixel unit, and the first sub-pixel which are sequentially arranged along the pixel row direction; a second pixel row in the repeating unit comprises the first sub-pixel, the second sub-pixel unit, the third sub-pixel, the third sub-pixel, the second sub-pixel unit, the first sub-pixel which are sequentially arranged along the pixel row direction; and a third pixel row in the repeating unit comprises the third sub-pixel, the second sub-pixel unit, the first sub-pixel, the first sub-pixel, the second sub-pixel unit, and the third sub-pixel which are sequentially arranged along the pixel row direction; a fourth pixel row in the repeating unit comprises the third sub-pixel, the second sub-pixel unit, the first sub-pixel, the first sub-pixel, the second sub-pixel unit, and the third sub-pixel which are sequentially arranged along the pixel row direction.

9. The pixel structure according to claim 8, wherein same sub-pixels are configured to have a sharing edge to form the pixel structure comprising a plurality of first sub-pixel groups, a plurality of second sub-pixel groups, and a plurality of third sub-pixel groups; a first sub-pixel group is formed by splicing four first sub-pixels, a second sub-pixel group is formed by splicing four second sub-pixels, and a third sub-pixel group is formed by splicing four third sub-pixels.

10. The pixel structure according to claim 9, wherein the first sub-pixel group is a red sub-pixel group formed by connecting four red sub-pixels; the second sub-pixel group is a green sub-pixel group formed by connecting four green sub-pixels; the third sub-pixel group is a blue sub-pixel group formed by connecting four blue sub-pixels.

11. The pixel structure according to claim 1, wherein the first sub-pixel is a red sub-pixel, the second sub-pixel is a green sub-pixel, the second sub-pixel unit comprises two green sub-pixels, the third sub-pixel is a blue sub-pixel.

12. The pixel structure according to claim 1, wherein,
the two second sub-pixels are connected to each other by a sharing edge to form the second sub-pixel unit in a shape of a quadrilateral.

13. The pixel structure according to claim 1, wherein,
the first sub-pixel and the third sub-pixel in the pixel unit are symmetrically distributed with respect to the second sub-pixel unit.

14. The pixel structure according to claim 1, wherein the first sub-pixel and the third sub-pixel are in a shape of a right triangle with a same shape and area.

15. The pixel structure according to claim 14, wherein the first sub-pixel and the third sub-pixel are in a shape of an isosceles right triangle with a same shape and area.

16. The pixel structure according to claim 1, wherein the first sub-pixel and the third sub-pixel are in a shape of a right triangle with a same shape and area; the two second sub-pixels are each in a shape of a first quadrilateral with a same shape and area, the second sub-pixel unit is in a shape of a second quadrilateral.

17. The pixel structure according to claim 1, further comprising a first pixel limiting layer configured to separate adjacent sub-pixel groups with different colors and a second pixel limiting layer configured to separate adjacent sub-pixels with a same color.

18. A display panel, comprising a pixel structure, wherein the pixel structure comprises a plurality of pixel units, each pixel unit is in a shape of a rectangle, the pixel unit comprises four sub-pixels, respectively one first sub-pixel, two second sub-pixels, and one third sub-pixel, the two second sub-pixels are connected by a sharing edge to form one second sub-pixel unit, the first sub-pixel and the third sub-pixel are respectively provided on opposite sides of the second sub-pixel unit;

wherein at least one of the two second sub-pixels is in a shape of a first quadrilateral, and wherein in the pixel unit, the one first sub-pixel, the one third sub-pixel, and the two second sub-pixels are arranged in a row, the first sub-pixel and the third sub-pixel are both in a shape of a triangle, two right angles located on the same long side of the rectangle in the rectangular pixel unit are respectively an angle between two sides of the first sub-pixel and an angle between two sides of the third sub-pixel.

\* \* \* \* \*